United States Patent
Rathei et al.

(10) Patent No.: US 6,553,521 B1
(45) Date of Patent: Apr. 22, 2003

(54) METHOD FOR EFFICIENT ANALYSIS SEMICONDUCTOR FAILURES

(75) Inventors: Dieter Rathei, Glenn Allen, VA (US); Thomas Giegold, Glenn Allen, VA (US); Joerg Wohlfahrt, Glenn Allen, VA (US)

(73) Assignee: Infineon Technologies, Richmond L.P., Sandston, VA (US)

( * ) Notice: Subject to any disclaimer, the term of this patent is extended or adjusted under 35 U.S.C. 154(b) by 0 days.

(21) Appl. No.: 09/511,169

(22) Filed: Feb. 24, 2000

(51) Int. Cl.$^7$ ............................................. G11C 29/00
(52) U.S. Cl. ................................................. 714/722
(58) Field of Search ............................. 714/723, 715; 365/201

(56) References Cited

U.S. PATENT DOCUMENTS

| | | | |
|---|---|---|---|
| 5,136,591 A | * | 8/1992 | Krause ....................... 714/715 |
| 5,410,687 A | * | 4/1995 | Fujisaki et al. ............. 365/201 |
| 5,530,805 A | | 6/1996 | Tanabe |
| 5,950,181 A | | 9/1999 | Federl ........................ 706/15 |
| 5,983,372 A | | 11/1999 | Fujiwara |
| 6,130,442 A | | 10/2000 | DiZenzo et al. |

* cited by examiner

Primary Examiner—Albert Decady
Assistant Examiner—Shelly A Chase
(74) Attorney, Agent, or Firm—Slater & Matsil, L.L.P.

(57) ABSTRACT

The present invention includes a method for characterizing semiconductor failure. The method includes determining the dimensions of certain characteristics of a memory chip. The method defines a group of characteristics for a semiconductor of given dimensions. The method defines a ratio based on variables supplied by production test systems. By comparing a set of characteristics for a specific semiconductor to the ratio to determine the dominant type of failure on the semiconductor chip. The invention is an efficient method of obtaining information regarding the types of failures common on semiconductor chips.

17 Claims, 1 Drawing Sheet

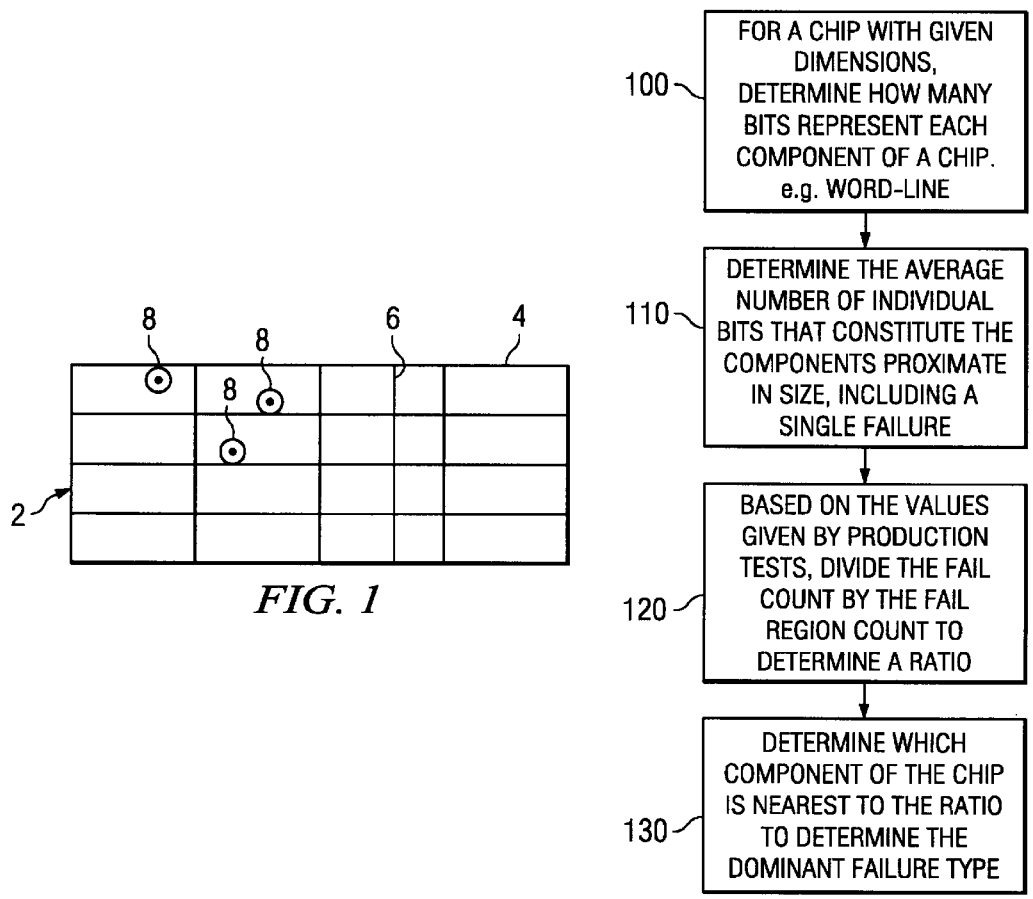
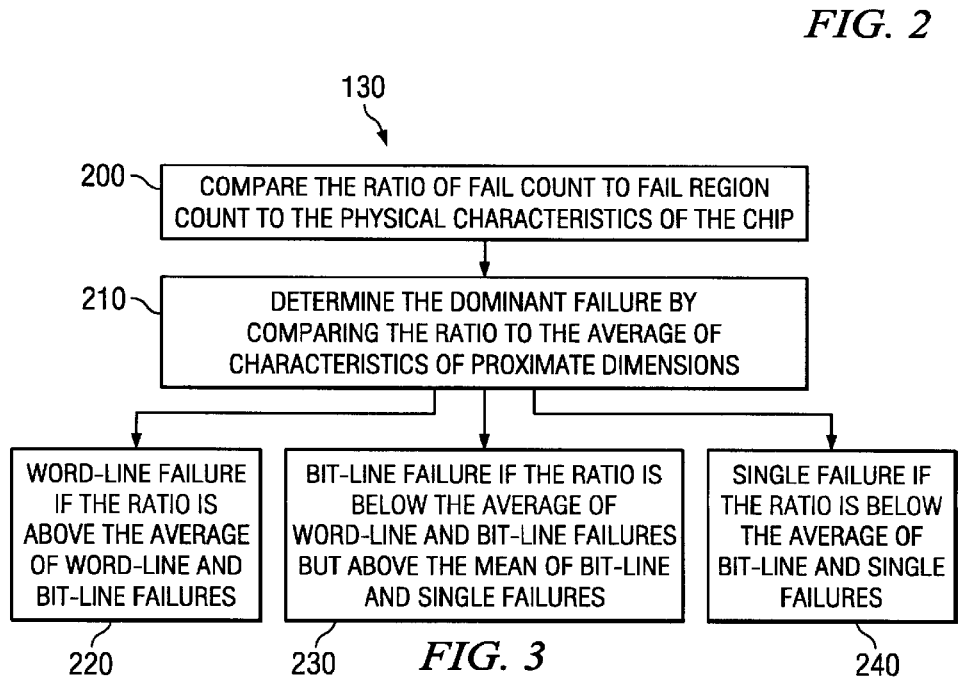

METHOD FOR EFFICIENT ANALYSIS SEMICONDUCTOR FAILURES

BACKGROUND OF THE INVENTION

1. Field of the Invention

This disclosure relates to semiconductor failure analysis, and more particularly to a method of efficiently classifying failure characteristics on semiconductor memories.

2. Description of the Related Art

Reliability and quality are at the core of the memory chip industry. To insure that these characteristics exist in the large number of chips produced, a method is needed to classify chips quickly and accurately. Classification is used to implement the appropriate corrective procedures to prevent the reoccurrence of failures. Typically, failure analysis has included electrical and visual inspection. When a failure has been identified, it is compared against records of previous failures to categorize the failure and possibly determine its source.

The classification of failure characteristics on semiconductor memories has been preformed by bit-mapping or case-by-case human judgment. The purpose of failure classification is to recognize probable causes of different failures and enable the assignment of an appropriate repair techniques or implementation of adjustments of the manufacturing equipment.

The bit map provides a high degree of detail but is costly and time consuming to produce and store. Likewise, evaluation on a case-by-case basis by skilled engineers is costly and time consuming, and further, it draws the engineers away from other projects. High costs make the current methods economically undesirable in a high-volume manufacturing environment such as in the production of semiconductor memory chips.

Therefore a need exists for an efficient method of analyzing semiconductor failure, which has little effect on throughput and maintains a high degree of accuracy.

SUMMARY OF THE INVENTION

The present invention discloses methods for characterizing semiconductor failures.

The method for characterizing semiconductor failures includes testing a semiconductor chip to determine a fail count, and a fail region count. The fail count is the number of individual failures, and the fail region count is the number of chip regions having at least one failing bit. The method defines the dimensions of semiconductor chip components. Each component may be represented by a characteristic number of bits. The number of bits representing each component relates directly to the number of bits representing each component failure type. The method computes a ratio of the fail count to the fail region count. By comparing component dimensions to the ratio, the method is able to determine a dominant type of component failure on the semiconductor chip. The dominant component failure should have the dimension nearest the ratio.

Component failure types may number two or more. The component failure types may comprise three failure types. The component failure types may include word-lines, bit-lines, and single failures.

A chip region for purposes of this invention can be any distinct group of bits for purposes of testing a semiconductor memory. A chip region may be, for example, the physical location of a block of bits or bits that share a common address characteristic throughout the semiconductor memory.

The step of defining dimensions above may include the steps of: determining the number of individual bits which represent each of the different components; and calculating an average number of bits which represent each component, the averages being determined between components which are proximate in size based on the total number of bits.

The step of defining a ratio may include the step of dividing the fail count by the fail region count to determine the ratio in accordance with the following relationship, $$\frac{\text{Fail Count}}{\text{Fail Region Count}} = X$$

where X is the ratio.

Likewise the step of comparing the dimensions to the ratio may include additional steps. One step may compare the dimensions of the components based on the total number of bits. The method may calculate the average number of bits between components proximate in size, based on the total number of bits. The method may compare the averages to the ratio. By using the averages as threshold values, the method may determine the dominant type of failing component, the dominant type of failing component having a dimension that is the nearest to the ratio as determined from the group of components having dimensions.

Another method for characterizing a semiconductor according to types of failures may include testing a semiconductor chip to determine a fail count, and fail region count. The fail count being the number of individual bit failures, and the fail region count being the number of chip regions having at least one failing bit. The method may define the dimensions of the semiconductor chip components and determine the number of different components. Each component has a characteristic number of bits and the number of bits included in each component relates directly to the number of representative bits included in each of the plurality of component failure types. The method may calculate the average number of bits between each component proximate in size based on the number of bits included in each component. The method may compute the ratio of the fail count to the fail region count. To determine a dominant type of component failure on the semiconductor chip, the method may compare the averages to the ratio. The dominant type of component failure may have the dimension nearest the ratio.

The step of calculating an average number of bits which represent each component may be accomplished in accordance with the following steps:

Calculate $(L+S)/2 = Y_{n-1}$.

Where L and S are proximate in size. L is the size of the failure including the larger number of individual bit failures between the pair L and S. S is the size of the failure including the smaller number of individual bit failures between the pair L and S. $Y_{n-1}$ is used as a threshold to determine whether the ratio is nearest L. The number of different component types is n. For each subsequent iteration the method may set n=n−1, and L equal to S from the previous calculation of $Y_{n-1}$. The method may calculate additional values of Y until n−1 equals 1.

The step of computing a ratio may be performed in accordance with the following relationship:

$$\frac{\text{Fail Count}}{\text{Fail Region Count}} = X$$

where X is the ratio.

The method may compare the averages to the ratio to determine a dominant type of component failure based on the dimensions of each component. For each value of $Y_{n-1}$ and its corresponding L and S failure dimensions, the method determines if the ratio is greater then $Y_{n-1}$, if so the dominate failure may be L. If n−1 is equal to 1, the method may determine if the ratio is greater then $Y_{n-1}$, if so the dominant failure may be L, if not the dominant failure dimension may be S.

A method for characterizing semiconductor failures may test for failures to determine a fail count and a fail region count, the fail count being the number of individual failures and the fail region count being a number of regions affected by at least one failure. The method may define dimensions for component failure types for a semiconductor chip, each component represented by a characteristic number of bits. The method may determine the number of different component types. The method may compute a ratio of the fail count to the fail region count, the fail count being the number of individual failures, and the fail region count being the number of chip regions having at least one failing bit.

The method may calculate an average number of bits which represent each dimension, the averages being determined between dimensions which are proximate in size based on a total number of bits. The method may calculate $(L+S)/2=Y_{n-1}$.

Where L is the size of the failure dimension incorporating a larger number of individual bit failures between the pair L and S, S is the size of a failure dimension incorporating the smaller number of individual bit failures between the pair L and S, where L and S are proximate in size. The method may use $Y_{n-1}$ as a threshold to determine whether the ratio is nearest L. The number of different component types is defined as n. For each subsequent iteration the method may set n equals n−1, and L equal to S from the previous calculation of $Y_{n-1}$. The method may calculate new value of Y until n−1 equals 1. The method may compare the component dimensions to the ratio to determine a dominant type of component failure on the semiconductor chip using the averages as threshold values.

The dominant type of component failure may have the dimension nearest the ratio, components may be compared on the basis of the number of bits which each includes. For each value of $Y_{n-1}$ and its corresponding L and S failure dimensions, the method may determine if the ratio is greater then $Y_{n-1}$, if so the dominate failure may be L. Where n−1 is equal to 1, the method may determine if the ratio is greater then $Y_{n-1}$, if so the dominant failure may be the dimension is L, if not the dominant failure may be S.

These and other objects, features, and advantages of the present invention will become apparent from the following detailed description of illustrative embodiments thereof, which is to be used in connection with the accompanying drawings.

BRIEF DESCRIPTION OF DRAWINGS

This disclosure will present in detail the following description of preferred embodiments with reference to the following figures wherein:

FIG. 1 is a schematic diagram of a memory device divided into 16 regions with four failures: three single cell failures; and one bit-line failure;

FIG. 2 is a flow chart showing a method for analyzing characteristics of memory chips to make determinations about the types of failures; and FIG. 3 is a flow chart showing an illustrative method of a final determination for a chip, which has three possible failure configurations, word-line, bit-line, and single failure.

DETAILED DESCRIPTION OF PREFERRED EMBODIMENTS

A preferred embodiment of the present invention will be described below in more detail with reference to the accompanying drawings. Through the use of the present invention, which may be embodied in hardware or software, classification of failing bits maybe achieved efficiently. The purpose of failure classification is to recognize causes of failures and enable the assignment of appropriate repair techniques or implementations of adjustments on manufacturing equipment.

As depicted in FIG. 1, for example, each memory chip 2 has certain physical characteristics; a 1 megabit (Mb) dynamic random access memory (DRAM) chip has a total of 16 regions. Each region 4 has certain components that may pass through it with known dimensions, for example, 128 bits for a bit-line component by 512 bits for a word-line component. Based upon these characteristics of the semiconductor chip, the present invention is able to determine the dominant type of failure affecting the chip.

A failure for purposes of this invention is any bit failure. The types of failures relate to the chip components, each component having a characteristic number of representative bits. For purposes of this invention the components are individual word-lines or bit-lines, however other embodiments of components are contemplated. The present example using a construct of three components is not intended to narrow the scope of the invention. The present invention may employ more then three components. Other embodiments may include other components such as, for example, half bit lines and forms of segmented word-lines.

Test systems provide the number of failing bits and the fail region counts (regions with at least one failing bit) for each chip. The number of failing bits is given regardless of what type of component failure an individual bit is incorporated in, so that for example, in FIG. 1, a bit-line failure will be recognized as 512 bit failures as explained below. By comparing the number of failing bits and fail region count, to the dimensions of the semiconductor components, the method identifies the dominant failure type.

According to block 100 of FIG. 2, the number of individual bits that represent each component is determined. These component dimensions relate to, for example, word-lines and bit-lines. In FIG. 1, for a 1Mb DRAM, for example, one bit relates to a single memory cell 8; 512 bits constitute a bit-line fail 6, and there are 2048 bits per word-line fail. Assuming that there are 128 bits per bit-line in each region 4, a bit-line failure 6 encompasses four regions in FIG. 1, therefore affecting 512 bits (4×128=512). There are 512 bits per word-line in each region, therefore a word-line failure affecting four regions will produce 2,048 individual fails (4×512=2,048).

The method calculates the average dimension of components proximate in size in block 110 of FIG. 2, for example (512+128)/2=320. 320 will serve as a threshold in the next step. A number above 320 will be closer to 512, indicating word-line failures as a dominating fail type, while a number below 320 will be closer to 128 indicating bit-line failures as a dominating fail type.

The method makes estimates about the relative predominance of the plurality of failures based on the number of individual failures and the dimensions of the chip components. For example, for the same 1Mb DRAM chip above, affected by three word-line failures, one bit-line failure, and two single failures, the fail count will be (3*2048)+512+2= 6658. The fail region count for the same chip will be (3*4)+(1*4)+2=18, assuming that the different failures do not overlap. In practice, the raw number of failures and affected fail regions may be provided by production test systems, without an indication as to the particular source of those failures, be that word-line, bit-line or single failures. For each chip, in block 120 of FIG. 2, the method divides the number of failing bits by the number of affected regions. In the example, 6658 divided by 18 is equal to 369.89.

According to block 130 of FIG. 2 and block 200 of FIG. 3, the method compares the resultant ratio of block 120 calculated above to the numbers of interest of block 110. From this comparison the method determines which type of failure is dominant as in block 210 of FIG. 3. For example, 369.89 is greater than average of bit-line and word-line component failures calculated above (320), therefore the number is closer to 512, indicating the dominance of word-line component failures, block 220 of FIG. 3. If the ratio of individual failures to the number of fail regions yields a number lower then 320 but above 64.5, the method will indicate the dominance of bit-line component failures, in block 230 of FIG. 3. A ratio below 64.5 will be an indication of single failures, in block 240 of FIG. 3.

The method averages the proximate dimensions of components of the chip.

The method may determine that there are n different components. For example n=3 where the components are word-lines, bit-lines, and single failures. In the example, the dimensions will relate to, word-line, bit-line, and single failures. Where L represents the larger failure from the group of L and S and S represents the smaller component failure from the group of L and S, in the example, during the first iteration L is a word-line and S is a bit-line.

$$(L+S)/2 = Y_{n-1}$$

In the example n is equal to 3 for the first iteration.

For each iteration thereafter set n=n−1, continue determining averages until n−1=1. For each iteration, set S equal to L from the previous determination of Y. For example, for $Y_1$, average L and S, where L is a bit-line component failure and S is the failure proximate in size to the new L, a single failure.

Determine the ratio of the Fail Count to the Fail Region Count.

$$\frac{\text{Fail Count}}{\text{Fail Region Count}} = X$$

Conduct a series of proofs to make the final determination.

If the ratio, X, is greater then $Y_2$ then the dominant failure is a Word-Line failure.

If the ratio, X, is greater then $Y_1$ then the dominant failure is a Bit-Line failure.

If the ratio, X, is less then or not greater than $Y_1$, the dominant failure is a single failure.

The method may function properly when the dimensions of the chip components are sufficiently unique. In the case of a chip with components of equal size, the numbers relating each type of failure will be the same. In this case, the invention will be able to determine if there is a predominance of single bit failures or component failures.

This invention is intended to increase the speed of error characterization in yield enhancement programs. The present invention may be effective in screening wafers with identified reliability problems caused by a single type of failure. The invention is not limited to the applications above. Other applications are contemplated, such as, for example, analysis of other chips or memory devices, such as, static random access memory (SRAM). The subject of the analysis need only have characteristic dimensions where identification of bit failure type needed. Further, the method may serve a useful purpose in any embodiment that has components composed of rows and columns, for example, display monitors, such as liquid crystal displays (LCD) or other devices having an array of cells or components.

Having described embodiments of a method for analysis of semiconductor failures, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set for in the appended claims.

What is claimed is:

1. A method of characterizing semiconductor failures, comprising:

testing a semiconductor chip to determine a fail count, and a fail region count, the semiconductor chip including a plurality of components;

defining dimensions for component failure types of semiconductor chip, each component represented by a characteristic number of bits;

computing a ratio of the fail count to the fail region count, the fail count being the number of individual bit failures, and the fail region count being the number of regions on the semiconductor chip having at least one failing bit; and comparing the dimensions to the ratio to determine a dominant type of component failure on the semiconductor chip, the dominant type of component failure being identified by the dimension nearest the ratio.

2. The method as recited in claim 1, wherein the step of defining dimensions, further comprises:

determining the number of individual bits in each of the plurality of components; and calculating an average number of bits which represent each component, the averages being determined between components which are proximate in size based on the total number of bits.

3. The method as recited in claim 1, wherein the step of defining a ratio, further comprises the step of:

dividing the fail count by the fail region count to determine the ratio in accordance with the following relationship, $$\frac{\text{Fail Count}}{\text{Fail Region Count}} = X$$

where X is the ratio.

4. The method as recited in claim 1, wherein the step of comparing the dimensions to the ratio, further comprises the steps of:

calculating an average number of bits which represent each component, the averages being determined between components which are proximate in size based on the total number of bits;

comparing the averages to the ratio; and using the averages as threshold values, to determine the dominant type of failing component, the dominant type of failing component having a dimension that is the nearest to the ratio as determined from the plurality of components having dimensions.

5. The method as recited in claim 1, wherein the component failure types number two or more.

6. The method as recited in claim 5, wherein the component failure types comprise three failure types.

7. The method as recited in claim 6, wherein the component failure types includes word-line failures, bit-line failures, and single failures.

8. A method for characterizing a semiconductor chip according to types of failures comprising:

testing the semiconductor chip to determine a fail count, and a fail region count, the semiconductor chip including a plurality of components;

defining dimensions for component failure types for the semiconductor chip, each component represented by a characteristic number of bits;

determining a number of different component types;

computing a ratio of the fail count to the fail region count, the fail count being the number of individual failures, and the fail region count being the number of chip regions having at least one failing bit;

calculating an average number of bits which represent each component dimension, the averages being determined between components which are proximate in size based on the total number of bits, includes the steps of:

calculating $(L+S)/2 = Y_{n-1}$ where L is the size of the failure dimensions incorporating a larger number of individual bit failures between the pair L and S, S is the size of the failure dimension incorporating a smaller number of individual bit failures between the pair L and S, where L and S are proximate in size, where $Y_{n-1}$ is a threshold to determine whether the ratio is nearest L, where n is the number of different component types;

where for each subsequent iteration set n=n−1, and set L equal to S from the previous calculation of $Y_{n-1}$; calculate Y until n−1=1; and comparing the averages to the ratio to determine a dominant type of component failure on the semiconductor chip, the dominant type of component failure being identified by the dimension nearest the ratio where the dimension is the number of bits included in the component failure type.

9. The method as recited in claim 8, wherein the step of computing a ratio is performed in accordance with the following relationship:

$$\frac{\text{Fail Count}}{\text{Fail Region Count}} = X$$

where X is the ratio.

10. The method as recited in claim 8, wherein the step of comparing the averages to the ratio to determine a dominant type of component failure is accomplished in accordance with the following steps:

for each value of $Y_{n-1}$ and its corresponding L and S failure dimensions, determine if the ratio is greater then $Y_{n-1}$, if so the dominate failure is L; and where n−1 is equal to 1, determine if the ratio is greater then $Y_{n-1}$, if so the dominant failure is L, if not the dominant failure is S.

11. The method as recited in claim 8, wherein the component failure types number two or more.

12. The method as recited in claim 11, wherein the component failure types comprise three failure types.

13. The method as recited in claim 12, wherein the component failure types includes word-line failures, bit-line failures, and single failures.

14. A method for characterizing semiconductor failures, comprising:

testing for failures to determine a fail count and a fail region count, the fail count being the number of individual failures and the fail region count being a number of regions affected by at least one failure;

defining dimensions for component failure types for a semiconductor chip. The semiconductor chip including a plurality of components, each component represented by a characteristic number of bits;

determining a number of different component types;

computing a ratio of the fail count to the fail region count, the fail count being the number of individual failures, and the fail region count being the number of chip regions having a least one failing bit;

calculating an average number of bits which represent each dimension, the averages being determined between dimensions which are proximate in size based on a total number of bits, includes the steps of:

calculating $(L+S)/2 = Y_{n-1}$ where L is the size of the failure dimension incorporating a larger number of individual bit failures between the pair L and S, S is the size of a failure dimension incorporating the smaller number of individual bit failures between the pair L and S, where L and S are proximate in size, where $Y_{n-1}$ is the threshold to determine whether the ratio is nearest L, where n is the number of different component types;

where for each subsequent iteration set n=n−1, and set L equal to S from the previous calculation of $Y_{n-1}$; calculate Y until n−1=1; and comparing the component dimensions to the ratio to determine a dominate type of component failure on the semiconductor chip using the averages as threshold values, the dominant type of component failure having the dimension nearest the ratio, components are compared on the basis of the number of bits which each includes, in accordance with the following steps:

for each value of $Y_{n-1}$ and its corresponding L and S failure dimensions, determine if the ratio is greater then $Y_{n-1}$, if so the dominate failure is L;

where n−1 is equal to 1, determine if the ratio is greater than $Y_{n-1}$, if so the dominant failure dimensions is L, if not the dominant failure is S.

15. The method as recited in claim 14 wherein the component failure types number to or more.

16. The method as recited in claim 15, wherein the component failure types comprise three failure types.

17. The method as recited in claim 16 wherein the component failure types includes word-line failures, bit-line failures, and single failures.

* * * * *